(12) United States Patent
Mirbeth et al.

(10) Patent No.: US 7,747,972 B2
(45) Date of Patent: Jun. 29, 2010

(54) METHODS AND APPARATUSES FOR TIMING ANALYSIS OF ELECTRONIC CIRCUITS

(75) Inventors: Michael Mirbeth, Steindorf (DE); Jens Bargfrede, Bremen (DE)

(73) Assignee: Infineon Technologies AG, Munich (DE)

( * ) Notice: Subject to any disclaimer, the term of this patent is extended or adjusted under 35 U.S.C. 154(b) by 577 days.

(21) Appl. No.: 11/635,380

(22) Filed: Dec. 7, 2006

(65) Prior Publication Data

US 2008/0141200 A1    Jun. 12, 2008

(51) Int. Cl.
*G06F 17/50* (2006.01)
(52) U.S. Cl. .................... 716/6; 716/4; 716/5
(58) Field of Classification Search .............. 716/1–6; 703/2, 14, 19
See application file for complete search history.

(56) References Cited

U.S. PATENT DOCUMENTS

| | | | |
|---|---|---|---|
| 4,263,651 A | | 4/1981 | Donath et al. |
| 5,835,380 A | * | 11/1998 | Roethig ............ 716/2 |
| 6,212,665 B1 | * | 4/2001 | Zarkesh et al. ....... 716/4 |
| 6,820,243 B1 | * | 11/2004 | Shey et al. .......... 716/4 |
| 7,194,716 B2 | * | 3/2007 | Croix ............. 716/6 |
| 7,205,854 B2 | * | 4/2007 | Liu ............... 331/57 |
| 7,359,843 B1 | * | 4/2008 | Keller et al. ......... 703/2 |
| 2002/0100006 A1 | * | 7/2002 | Kosugi ............ 716/6 |
| 2006/0041772 A1 | * | 2/2006 | Doi ............... 713/500 |
| 2006/0117287 A1 | | 6/2006 | Bergler et al. |

OTHER PUBLICATIONS

Hitchcock, Robert B., Sr., "Timing Verification and the Timing Analysis Program," 19th Design Automation Conference, IBM General Technology Division, Endicott, New York 13760, Paper 34.2, pp. 594-604. 1982 IEEE.
Abstract, "Synopsis — CCS Timing Liberty Syntax," Synopsys, Inc., Mountain View, California, Nov. 9, 2005, pp. 1-21.
Abstract, "Synopsis—CCS Timing Technical White Paper," Version 1.0, Synopsys, Inc., Mountain View, California, Nov. 8, 2005, pp. 1-14.
McMurchie et al., "Wta—Waveform-Based Timing Analysis for Deep Submicron Circuits," Department of Electrical Engineering, University of Washington, Seattle, Washington, 2002 IEEE, pp. 625-631.
Internet article, "Static Timing Analysis," from Wikipedia (http://en.wikipedia.org/wiki/Static_timing_analysis), three pages. no date available.
Blaauw, David, "Slope Propagation in Static Timing Anyalysis," IEEE Transactions on Computer-Aided Design of Integrated Circuits and Systems, vol. 21, No. 10, Oct. 2002, pp. 1180-1195.

\* cited by examiner

*Primary Examiner*—Paul Dinh
(74) *Attorney, Agent, or Firm*—Brinks Hofer Gilson & Lione (57) ABSTRACT

Methods and apparatuses for timing analysis are provided using stages having an input and at least one output. A circuit portion connected to the output is taken into account when analyzing the stage.

39 Claims, 3 Drawing Sheets

METHODS AND APPARATUSES FOR TIMING ANALYSIS OF ELECTRONIC CIRCUITS

RELATED APPLICATIONS

This application is related to U.S. patent application Ser. No. 11/635,371, "Methods and Apparatuses for Timing Analysis of Electronic Circuits," filed on even day herewith, the contents of which are incorporated by reference in their entirety herein.

BACKGROUND

1. Technical Field

The present invention relates to methods and apparatuses for timing analysis of electronic circuits.

2. Background Information

Timing analysis in general is used in the context of analysis of electronic circuits, for example during the design of electronic circuits. In such electronic circuits, the timing of the circuit has to be checked such that signals generated by one circuit element reach another circuit element at an appropriate time. A simple example for this is some circuit element creating a signal which is to be sampled in a flip-flop controlled by a clock signal. The signal has to be present in a steady state at the flipflop a certain time before the sampling time defined by the clock signal (the so-called setup time) and a certain time after the sampling time defined by the clock signal (the so-called hold time) to ensure a correct sampling of the signal.

Figure 1:
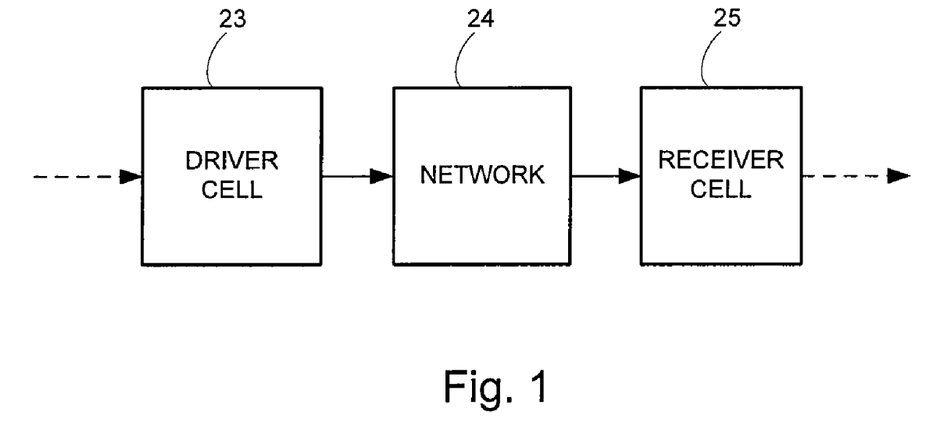
FIG. 1 is a diagram showing an exemplary stage of a circuit.

A more generalized version of this situation is shown in FIG. 1. FIG. 1 shows a so-called stage of an electronic circuit, for example a synchronous, digital circuit, wherein a signal is generated by a so-called driver cell 23 and passed to a receiver cell 25 via a network 24 which, as will be explained below, usually is a parasitic network. The driver cell 23 may, as indicated by a dashed arrow, also act as a receiver cell of a previous stage and generate the signal dependent on a further signal received. On the other hand, as also indicated by a dashed arrow, the receiver cell 25 may also act as a driver cell for a subsequent stage by sending a signal depending on the signal received from driver cell 23 via network 24.

It should be noted that the signal generated by driver cell 23 may be forwarded to a plurality of receiver cells like receiver 25 via network 24 or a plurality of networks. A single driver cell, the set of receiver cells receiving the signal from said driver cell and the network or networks coupling the driver to the set of receivers will, as already noted above, in the following be called a "stage". An electronic circuit may be seen as a plurality of stages.

Network 24 is usually a network comprising capacitances, resistances, diodes and/or inductances, i.e. a passive network. The components of network 24 may in principle comprise components intentionally provided, like diodes for preventing excessive signal peaks, but in many cases is a parasitic network. Network 24, for example through RC elements, leads to distortions and/or delays of the signal from driver cell 23 to receiver cell 25. Driver cell 23 and receiver cell 25 have a structure depending on the electronic circuit to be examined and may for example comprise a plurality of transistors and other elements each.

It should be noted that very often in electronic circuits a driver cell like driver cell 23 or a receiver cell like receiver cell 25 has a plurality of inputs, also called input pins hereinafter. For example, receiver cell 25 may receive signals from a plurality of driver cells and would thus be part of a plurality of stages as explained above and may additionally receive external signal inputs which may also vary or be held constant.

As already explained, in electronic circuits it may be necessary that the signal from the driver cell reaches the receiver cell at a certain time, for example a certain time before and after a pulse of a clock signal fed to the receiver cell. Since modern integrated electronic circuits like microprocessors may comprise millions of transistors or, in terms of stages, thousands of stages or more, and these stages may be interrelated in a number of ways, tools are necessary to check and simulate the timing behavior of the electronic circuit before the actual implementation.

In principle, it is possible to employ so-called analog simulation to simulate the circuit. For analog simulations, usually each circuit element like transistors is represented by a set of differential equations, and these equations are solved for example using a time step method. Models for transistors which are employed in this respect often comprise over a hundred parameters. Therefore, with the computing power currently available, it is difficult to fully simulate whole circuits comprising millions of transistors for all possible combinations of inputs to the circuit, so-called input patterns, within a reasonable time frame. For example, conventional analog simulation has been able to simulate circuits comprising 50,000 transistors with a single input pattern.

Therefore, to perform a timing analysis the so-called static timing analysis (STA) is conventionally employed. In static timing analysis, the basic principle is to only consider "extremal" timing events and not to analyze all possible input patterns at the input terminals of a circuit design concurrently. In particular, no series of switchings at an input is analyzed, but only a single switching of one (or possibly more) input(s), while the remaining input(s) are held constant. Extremal timing events in this case are for example those input patterns which lead to the latest or earliest arrival of a signal at a given receiver cell. If these latest and earliest arrivals fulfill the timing requirements of the circuits, all other timing events are assumed to also fulfill the requirements. By using simplifications like the ones mentioned above, the computational effort of static timing analysis is linear with respect to the complexity of the design and not exponentially as it would be for a full analog simulation.

In conventional static timing analysis, a circuit design is broken down into the above-defined stages, and signal waveforms at the output terminals of a given stage are determined depending on signal waveforms at the input terminal of that stage. Accordingly, the circuit design is processed stage by stage according to a topological sorting of the stages starting at the input terminals of the design such that the required input signal for the next stage to be processed is available.

In conventional static timing analysis, to analyze the timing behavior of the signals, the receiver cells in a given stage are usually modeled as single capacitances which may be viewed as part of network 24 of FIG. 1.

Figure 2:
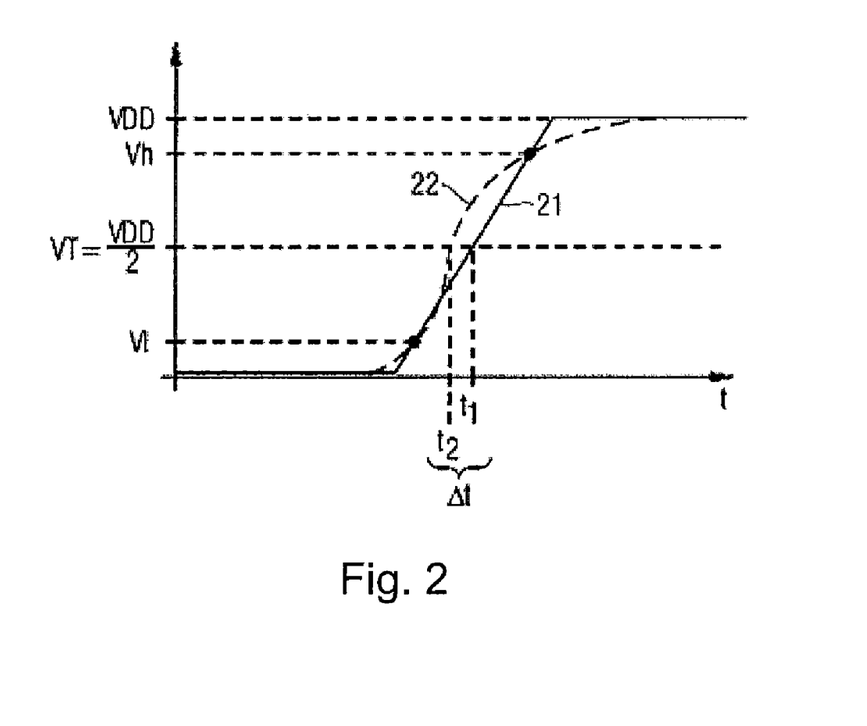
FIG. 2 is a diagram showing slopes of signals.

Additionally, in conventional static timing analysis signal transitions from one state to another state (i.e. a transition between the two possible states of digital signals) are approximated as ramps, and a single voltage point is usually taken as a delay threshold for delay measurement of the transition. This situation is depicted in FIG. 2, where a signal 21 changes from logic 0 to a positive voltage VDD representing a logic 1. In the examplary diagram of FIG. 2, the ramp of signal 21 is chosen such that it crosses the actual signal which basically corresponds to curve 22 at voltages Vl, Vh. Vl may be set to 10% of VDD, and Vh may be set to 90% of VDD. The time between signal 21 reaching Vl and signal 21 reaching Vh is taken as a transition time, in the present case indicating the time necessary to change from a logic 0 to a logic 1. The delay threshold in the example shown is set to the point where signal 21 crosses VT=VDD/2, which time is designated t1 in FIG. 2. However, other values for VT may also be chosen. Through the approximations of signals as ramps, the signals may be characterized by a single parameter like the above-mentioned transition time or slew, or by a only few parameters.

However, true signal behavior may differ significantly from that. For example, a signal may have a shape as depicted by dashed line 22 in FIG. 2. As can be seen, the real signal waveform crosses the voltage VT at a different time t2, such that t1 is only an approximation missing the true value by Δt. When such deviations from the actual signal waveform become significant compared to the transition time, this leads to increasing inaccuracies of the timing analysis. For critical paths, i.e. paths were timing requirements are only barely fulfilled or barely not fulfilled, this may even lead to errors in the analysis.

Also, the representation of a receiver as a single capacitance as mentioned above is only an approximation, which also may lead to inaccuracies of the static timing analysis. In this respect, classic static timing analysis uses a library where the electrical characteristics of a plurality of possible driver cells, for example the behavior of the cells dependent on an input signal as characterized by the above-mentioned parameter(s) are stored. When evaluating a stage, the electrical characteristics of the driver cells are taken from that table, which also is an approximation.

Therefore, as circuits become more and more complex and timing in circuits often becomes more and more critical, there is a general need for methods and apparatuses for timing analysis of electronic circuits which improve the accuracy and which are still feasible in terms of computational effort.

BRIEF SUMMARY

A method for a timing analysis of an electronic circuit is disclosed. The method includes defining a stage having an input and at least one output; determining a circuit portion connected to the at least one output influencing the timing behavior of said stage; and evaluating the timing behavior of said stage based on a simulation of said stage and said circuit portion.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

Embodiments of the present invention will be described hereinafter with reference to the accompanying drawings which are to be taken as an example only and not to be construed as limitative, wherein.

DETAILED DESCRIPTION

Figure 3:
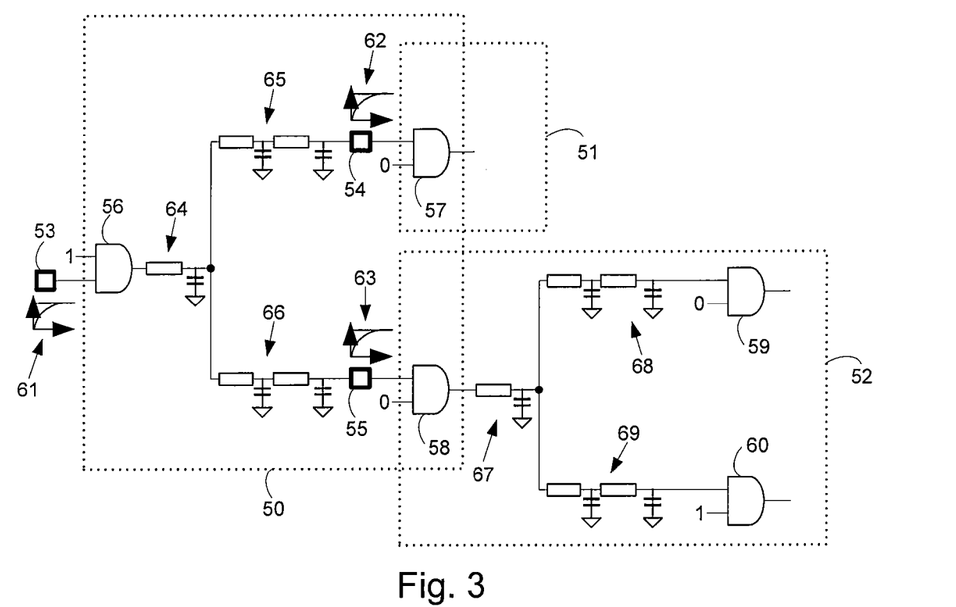
FIG. 3 is a circuit diagram for illustrating features of certain embodiments of the present invention.

Using the above explanations and definitions, embodiments of the invention will be described with reference to FIGS. 3-5. FIG. 3 represents a circuit diagram of a part of an electronic circuit, for example a digital synchronous circuit, which is used for explaining some of the features of some embodiments of the present invention.

In embodiments of the present invention, when analyzing a stage of a circuit design, previous and/or following stages are taken into account. This general concept may be designated "overlapping multi-stages" and can be seen in FIG. 3. In FIG. 3 a stage 50 to be analyzed having a driver cell 56 and two receiver cells 57, 58 is depicted. An input pin 53 of driver cell 56 is treated as the input of stage 50. Driver cell 56 may have further input pins, one of which is depicted in FIG. 3 and is shown as being constantly supplied with a logic 1. These further input pins of driver cell 56 are regarded as side inputs of stage 50.

An output of driver cell 56 is coupled with an input pin 54 of receiver cell 57 via a network comprising parts 64, 65 and with an input pin 55 of receiver cell 58 via a network comprising parts 64, 66. Input pins 54 and 55 of receiver cells 57 and 58, respectively, are output pins of stage 50 according to the definition given above. Network parts 64, 65, 66 are exemplary depicted as RC networks having resistances and capacitances in FIG. 3, but they may comprise resistances and capacitances arranged in a different manner than depicted and also inductances. Network part 64 is common to the networks coupling driver cell 56 to receiver cells 57 and 58, whereas network part 65 is part of the network coupling driver cell 56 with receiver cell 57 and network part 66 is part of the network coupling driver cell 56 with receiver cell 58.

According to embodiments of the present invention, a simulation is employed for analyzing a stage. For such a simulation, the structure of the driver cell, for example driver cell 56 of stage 50, and the receiver cells, for example receiver cells 57 and 58 of FIG. 3, in embodiments of the invention may be provided as so-called transistor level netlists suitable for simulation.

One possible type of simulation usable in embodiments of the present invention is analog simulation. However, other types of simulation like Fast MOS simulation may also be employed. In general, in the context of the present application simulation refers to any method which is able to model a signal waveform with a controlled stepsize to achieve a desired accuracy. Stepsize in this respect designates the distance in time between two signal values determined by the simulation. This stepsize in some simulations may vary such that almost linear parts of the signal waveform are determined using a comparatively large stepsize, while parts having a high curvature are determined using a comparatively small stepsize.

As can be explained with reference to FIG. 3, in embodiments of the present invention so-called multi-stages are used, i.e. for simulating a stage having an input and outputs like input 53 and outputs 54 and 55 in FIG. 3, the following stages, in particular the receivers connected to the outputs of the actual stage, are taken into account and simulated to achieve an exact modeling. Moreover, as already explained for simulating an entire electronic circuit, stages are processed sequentially. Accordingly, waveforms like waveforms 62, 63 calculated at the output of the actual stage based on an input waveform like waveform 61 are used as input waveforms for the subsequent stage, i.e. in the example of FIG. 3 for the stages where cells 57 and 58 are the respective driver cells.

To achieve this, the output waveforms of one stage or selected points thereof may be stored in a table and then interpolated to recover the waveforms when simulating the subsequent stage. Other ways of storing are also possible, for example storing parameters of splines forming the signal waveform. In embodiments of the invention, the waveform, for example by choosing an appropriate number of stored values, is stored such that the recovered waveform matches the actual waveform with an accuracy not introducing significant errors into the timing analysis.

In this respect, some embodiments of the present invention take into account that input pins of receiver cells like input pin 54 of receiver cell 57 or input pin 55 of receiver cell 58 of FIG. 3 may be capacitively coupled to output pins of the respective receiver cell and therefore to further stages of the circuit which may also influence the results. Embodiments of the present invention therefore include subsequent stages in the simulation of the stage under examination.

As for complex electronic circuits the number of subsequent stages of a stage under examination may be very high, embodiments of the present invention use information regarding the receiver cells for determining if and how many subsequent stages have to be taken into account. This information may be obtained by analyzing the part of a netlist describing the cells, i.e. by a general characterization of possible configurations of receiver cells prior to the actual timing analysis, and be stored in timing libraries.

A possible information may be to attribute one or more "shielding-grade" values to each receiver cell. In embodiments, one shielding-grade value is assigned to each timing arc of a cell. However, in principle assigning a single global value to the cell, for example the minimum of the above values, is also possible. Also, in case a cell has more than one output, the shielding-grade value may vary depending on the output considered. The shielding-grade for a given "timing arc" of a cell, i.e. for a given combination of input pin of a cell and output pin of a cell, together with given fixed values for the remaining input pins of the cell (if any), for example input pin 54 of receiver cell 57 and the shown output pin of receiver cell 57, or input pin 55 of receiver cell 58 and the corresponding output pin, may, in an embodiment of the invention, be defined as follows:

If a change of the state of the input pin (so-called "toggling" of the input pin), for example from 1 to 0 or from 0 to 1, causes a change of the output of the cell (so-called "toggle arc"), the shielding-grade is defined to be the minimum number of elementary gates (for example CMOS inverters) being involved when traversing the transistor level netlist of the respective cell along all possible paths from the input pin to the output pin. In case toggling of the input pin does not change the output of the cell (a non-toggle arc), the shielding-grade is set to infinity.

The lower the shielding-grade value of a given arc is, the more influence a further stage connected to the output pin has on the behavior of the stage under evaluation. In embodiments of the invention, subsequent stages and cells are taken into account until a predetermined shielding-grade limit is reached. A higher shielding-grade limit generally leads to a higher computational complexity and also to a higher accuracy. Therefore, the shielding-grade limit is chosen depending on the accuracy required and the computing time and power available.

This concept will now be further clarified referring again to FIG. 3. As an example, the determination of shielding grades mentioned above may result in a shielding-grade of 2 for a timing arc with side input 0 as shown of receiver cell 57, a shielding grade of 1 for a timing arc with side input 0 of receiver cell 58, a shielding-grade of 1 for a timing arc with side input 0 of receiver cell 59 and a shielding-grade of 2 for a timing arc with side input 1 of a receiver cell 60, receiver cells 59 and 60 being coupled with receiver cell 58 as shown. The shielding-grade limit in this example is set to 2.

When determining which "receiver trees" to consider, looking at receiver cell 57 the shielding-grade limit of 2 is already reached with this receiver cell. Therefore, no subsequent stage where receiver cell 57 is the driver cell has to be evaluated in this case.

The "receiver tree" 51 therefore has a depth of 0, i.e. it consists only of receiver cell 57.

On the other hand, receiver cell 58 for the timing arc from input pin 55 to the depicted output has a shielding grade of only 1. Hence, the shielding-grade limit of 2 is not reached. Therefore, a subsequent stage is evaluated in the embodiment discussed. In this subsequent stage receiver cell 58 of stage 50 actually serves as driver cell, and the already mentioned receiver cells 59 and 60 act as receiver cells of the subsequent stage. The output of receiver cell 58 is connected via a network comprising parts 67, 68 with an input pin of receiver cell 59 and via network comprising parts 67, 69 with an input pin of receiver cell 60. Network parts 67, 68 and 69 correspond to network parts 64, 65 and 66 of stage 50. It should be noted that also receiver cells 59 and 60 may have more than the above mentioned side inputs, i.e. input pins, than the one which is depicted for each of receiver cells 59 and 60 and which is fed a "0" in case of receiver cell 59 and a "1" in case of receiver cell 60.

Since in the example receiver cell 59 has a shielding-grade of 1, with receiver cell 59 the shielding-grade limit of 2 is reached (one for receiver cell 58 and one for receiver cell 59), so no subsequent stage where receiver cell 59 would be driver cell has to be taken into account. Likewise, since receiver cell 60 in the example given has a shielding-grade of 2, also here with an accumulated shielding grade of 3 the shielding grade limit of 2 is reached and no subsequent stage has to be considered. Therefore, the "receiver tree" 52 of receiver cell 58 has a depth of 1, i.e. one further stage is taken into account.

Through the use of information like the above-discussed shielding-grade in embodiments of the present invention, the computational effort may be reduced compared to a complete analysis of all subsequent stages.

If the shielding-grade limit were set to 3, for example after receiver cell 59 a further stage would have to be taken into account, in contrast to receiver cell 60 where also the limit of 3 is already reached.

It should be noted that, as mentioned above, the shielding grade of the cells may change depending on the timing arc under consideration, i.e. also depending on the state of the side inputs, which in turn may lead to different receiver trees. In embodiments of the invention, for the evaluation of one multi-stage the various possible receiver trees are determined and evaluated. Also, a cell may have more than one output which, in embodiments, leads to additional receiver trees being generated.

Other embodiments of the present invention additionally or alternatively may employ a concept which, in the context of this application, will be labeled "load prioritization" and which will be explained below.

As already mentioned, both driver cell 56 and receiver cells 57 and 58 may have more input pins than the input pins 53, 54 and 55 which form the input and outputs of stage 50, i.e. side inputs. The states of these additional pins or side inputs, however, may influence the timing behavior of the stage. If the overall number of input pins of a receiver cell is n, the number of possible side-input patterns for this receiver cell is $2^{n-1}$ assuming that each input pin is fed either a "0" or a "1". To ensure a correct timing analysis, all the possible combinations would have to be evaluated. Moreover, the possibility of one receiver cell would have to be combined with all the possible side input patterns of the other cells also in the receiver trees, which in case of a plurality of input pins could lead to a very large number of combinations to be evaluated.

Embodiments of the invention use an information stored in a timing library, for example the already mentioned timing library comprising the shielding grades, which is used to determine which side-input patterns have to be evaluated for timing analysis. In particular, in embodiments of the invention, only "extremal" combinations are evaluated, e.g. combinations which lead to the earliest possible arrival of a signal at an output pin or to the latest possible arrival of a signal at an output pin. Since signal propagation is dependent on the load, in particular on the dynamic load of receiver cells or the corresponding receiver trees, in embodiments of the invention during a pre-characterziation of cells for forming a timing library as already mentioned above, a "maxLoadPriority" and a "minLoadPriority" value is assigned to each timing arc of each cell. A timing arc, as already defined above, as defined by a given input pin and a given output pin with a given configuration of the remaining side-input pins of the respective cell.

The maxLoadPriority values are assigned such that the timing arc causing the largest load is assigned the lowest priority, for example 0, while the remaining timing arcs are assigned maxLoadPriority values in ascending order with descending load. In a similar manner, the timing arc representing the lowest dynamic load is assigned the smallest minLoadPriority value, for example 0, and the remaining timing arcs are assigned minLoadPriority values in ascending order according to ascending dynamic load.

For obtaining this information to be stored in the timing library, in embodiments cells are simulated with a range of input signals having different slews and a range of loads connected to the outputs thereof for all input signal/load-combinations, i.e. according to a slew/load-matrix.

As already explained, the timing library thus obtained provides a general characterization for a plurality of cells which is then used for analyzing a specific circuit design. In such a specific circuit design, some timing arcs of a cell may be "forbidden" in the sense that these timing arcs cannot occur in the actual circuit. For example, referring to FIG. 3, in principle the side-input shown for receiver cell 57 may be fed a logic 0 or a logic 1. If, however, in a specific circuit design this side-input is for example fixedly connected to ground representing logic 0, timing arcs where this input is being fed a logic 1 cannot occur and therefore are forbidden timing arcs. To take this into account, in embodiments of the present invention a maxLoad timing arc and a minLoad timing arc is determined for a given input and output of a cell, for example for input 53 and the shown output of driver cell 56 or input 54 and the shown output of receiver cell 57 in FIG. 3. The maxLoad timing arc of a cell in a circuit design is defined as the timing arc between the given input pin and the given output pin having the lowest maxLoadPriority value which is not a forbidden timing arc. Correspondingly, the minLoad timing arc in this embodiment is defined as the timing arc having the lowest minLoad priority value which is not a forbidden timing arc. Therefore, using the information in the timing library, for a given cell in a circuit design the timing arc with the maximum load and the timing arc with the minimum load may be identified. Accordingly, the maxLoad timing arc is used for the calculation of the late signal (the latest possible arriving signal), and the minLoad timing arc is used for the calculation of the early signal (the earliest possible arriving signal).

To determine the timing arcs of the whole receiver tree which have to be taken into account, embodiments of the present invention may assign an additional property to each timing arc during pre-characterization, i.e. the building of the timing library, which takes interaction between successive timing arcs into account. Interaction, in this respect, means that the load behavior of a cell may be influenced by one or more further cells coupled to the output of said cell. For example, the load of an inverter assumes a maximum value if a minimum load is connected to its output and assumes a minimum value if a maximum load is connected to its output.

In this embodiment, an outputLoad property is assigned to the maxLoadPriority and the minLoadPriority of each toggle arc (toggle arc being defined as above) of each cell and stored in a timing library. The outputLoad property may assume either a value of "max" or "min". In particular, when building the library the outputLoad property assigned to the maxLoadPriority of a toggle arc is set to "max" if the dynamic load being represented by the timing arc to which the property is assigned gets maximal if a further timing arc driven by said timing arc, i.e. connected to the output of said timing arc, is a maxLoad timing arc as defined above and to "min" if the dynamic load gets maximal when the further arc is a minLoad timing arc. Conversely, the outputLoad property assigned to the minLoadPriority of the toggle arc is set to "min" if the dynamic load being represented by the timing arc to which the property is assigned gets minimal if a further timing arc driven by said timing arc is a minLoad timing arc as defined above and to "max" if the dynamic load gets minimal if the further timing arc is a maxLoad timing arc. Since when the outputLoad property assigned to the maxLoadPriority is "max" the outputLoad property assigned to the minLoadPriority is "min" and vice versa, in another embodiment only one outputLoad property is stored. Also, in different embodiments the properties are not stored in a library, but calculated when performing the timing analysis.

Then, the multi-stage to be evaluated according to an embodiment is determined as follows:

As a starting point for the construction of the multi-stage, to calculate the late signal being generated by a given timing arc, for example by a given timing arc of driver cell 56 of FIG. 3, all timing arcs of the corresponding multi-stage being successive to that timing arc (for example the stages shown in FIG. 3) would be chosen to be maxLoad timing arcs as defined above.

Correspondingly, to calculate the early signal being generated by a given timing arc, all timing arcs of the corresponding multi-stage being successive to that timing arc would be chosen to be minLoad timing arcs as defined above.

For determining the multi-stage, then the timing arcs downstream of the above-mentioned successive timing arcs would be set to "maxLoad" timing arcs, if the output load property of the corresponding upstream timing arc of that downstream timing arc is "max", and to "minLoad" timing arcs if the output load property of the corresponding upstream timing arc is "min".

In embodiments, for the "last" timing arcs or cells in a multi-stage, i.e. cells forming the "leafs" of the corresponding receiver tree, an open connection at its output is used as a minimum load and a short connection at its output is used as a maximum load depending on the outputLoad property of the timing arc.

Therefore, using this load prioritization information in a library, the necessary calculations can be limited to one or a few multi-stages with a corresponding set of input pins for the late signal and one or a few multi-stages for the early signal. It should be noted that, in embodiments of the invention, this concept is combined with the shielding-grade concept described above. Therefore, corresponding embodiments of the invention offer a significant reduction of the number and depth of multi-stages to be simulated.

Another embodiment of the present invention uses a more complex procedure to determine which multi-stages have to be evaluated which, on the one hand, leads to a more complex evaluation and therefore needs more computing time, but which, on the other hand, takes some more properties of driving cells and electronic circuits into account and therefore leads to a greater accuracy.

The first issue which is taken into account in this embodiment is the fact that the electrical characteristics of timing arcs between identical cell pins, which are of opposite "unateness" (i.e. one timing arc is inverting and the other timing arc is non-inverting) usually differ significantly. In this respect, a non-inverting timing arc is a timing arc where, if a 1 is fed to the input pin, a 1 is output at the output pin, and if a 0 is fed to the input pin, a 0 is output at the output pin. Conversely, an inverting timing arc is a timing arc where, when a 1 is fed to the input pin, a 0 is output at an output pin, and if a 0 is fed to the input pin, a 1 is output at the output pin. As a simple example for this, an exclusive OR-gate (XOR-gate) having two inputs A and B and one output Z may be taken. The timing arc from input A to output Z is a non-inverting timing arc as long as a 0 is applied to input B and is an inverting timing arc as long as a 1 is applied to input B.

A second issue which is addressed in this embodiment is the fact that the method according to the previously discussed embodiment may in some instances lead to a signal propagation wherein output waveforms of a given multi-stage are propagated exclusively along toggle arcs in driving mode, but may have been calculated due to non-toggle arcs in receiving mode. Therefore, in the method employed in the currently discussed embodiment, so-called "maxLoadToggle" and "minLoadToggle" timing arcs are taken into account, which basically correspond to the maxLoad and minLoad timing arcs discussed with respect to the previous embodiments but which are always toggle arcs.

Therefore, in this embodiment, for a given timing arc, for example a timing arc of a driver cell like driver cell 56 of FIG. 3, as many multi-stages being driven by that timing arc as necessary have to be generated and evaluated to make sure that for each receiver cell input pin being connected to the output pin of that timing arc and for each receiver cell output pin being connected to one of these receiver cell input pins (for example, receiver cell input pins 54, 55 of FIG. 3 and the output pins of receiver cells 57 and 58) the following four conditions are to be fulfilled:

If there is at least one inverting timing arc having its input at a given receiver cell input pin and having its output at a corresponding receiver cell output pin, at least one multi-stage covering the related maxLoad toggle/inverting timing arc is to be evaluated.

If there is at least one non-inverting timing arc having its input at a given receiver cell input pin and having its output at a corresponding receiver cell output pin, at least one multi-stage covering the related maxLoadToggle/non-inverting timing arc is to be evaluated.

If there is at least one inverting timing arc having its input at the given receiver cell input pin and having its output at a corresponding receiver cell output pin, at least one multi-stage covering the related minLoadToggle/inverting timing arc is to be evaluated.

If there is at least one non-inverting timing arc having its input at the given receiver cell input pin and having its output at a corresponding receiver cell output pin, at least one multi-stage covering the related minLoadToggle/non-inverting timing arc is to be evaluated.

The former two cases or multi-stages are then used for calculating late signals, while the latter two types of multi-stages are used for calculating early signals.

A maxLoadToggle timing arc in this respect is the toggle timing arc which has the lowest maxLoad priority of all non-forbidden toggle timing arcs between a given input pin and a given output pin. In other words, the maxLoadToggle timing arc and the corresponding side-input pattern are determined in the same manner as the maxLoad timing arc of the previous embodiment with the additional requirement that the timing arc is a toggle timing arc.

Conversely, a minLoadToggle timing arc is the toggle timing arc which has the lowest minLoad priority of all non-forbidden toggle timing arcs between a given input pin and a given output pin.

While in this embodiment four conditions or cases are distinguished, in other embodiments a different number of conditions, for example more than four conditions, or conditions different from the ones listed above may be taken into account.

A possible algorithm for enumerating the multi-stages to be considered with respect to a given driving timing arc will be explained with reference to the following table:

| | | | |
|---|---|---|---|
| S_toggle[1]\S[1] | S[2] | S[3] | S[4] |
| S_toggle[1]*S[1] | S[2] | S[3] | S[4] |
| S[1] | S_toggle[2]\S[2] | S[3] | S[4] |
| S[1]\S_toggle[1] | S_toggle[2]*S[2] | S[3] | S[4] |
| S[1] | S[2] | S_toggle[3]\S[3] | S[4] |
| S[1]\S_toggle[1] | S[2]\S_toggle[2] | S_toggle[3]*S[3] | S[4] |
| S[1] | S[2] | S[3] | S_toggle[4]\S[4] |
| S[1]\S_toggle[1] | S[2]\S_toggle[2] | S[3]\S_toggle[3] | S_toggle[4]*S[4] |

This scheme is exemplary for the situation where a multi-stage similar to the one depicted in FIG. 3 has four output pins corresponding to four input pins of receiver cells of the multi-stage (the multi-stage shown in FIG. 3 has two output pins 54 and 55). The following abbreviations are used in the above table:

S[j] designates the set of side-input patterns which are "extremal" among all possible side-input patterns of timing arcs having their input at a receiver cell input pin j and having their output at the corresponding receiver cell output pin k. "Extremal" in this case refers to side-input patterns leading to a maximum load for late signal calculation or to a minimum load for early signal calculation. These side-input pattern(s) may be determined by using the maxLoadPriority values and minLoadPriority values of the timing library as explained above.

S_toggle[j] corresponds to S[j] when only side-input patterns are considered with which the timing arc in question from input pin j to output pin k is a toggle arc.

S_toggle[j]\S[j] represents the set of side-input patterns which are in the set S_toggle[j] but not in the set S[j].

S[j]\S_toggle[j] represents the set of side-input patterns which are in set S[j] but not in set S_toggle[j], or in other words side-input patterns which are extremal among all side-input patterns but are not extremal side-input patterns which lead to the respective timing arc being a toggle arc.

S_toggle[j]*S[j] is a set of side-input patterns which are both present in set S_toggle[j] and S[j].

The method depicted in the above table is an embodiment for a multi-stage having four outputs. Therefore, four corresponding input pins of receivers connected to said four outputs have to be considered. The enumeration scheme of the table is processed row by row, i.e. first the first row, then the second row and so on. In the first column, the side-input patterns to be enumerated for the first output of the multi-stage are given, in the second column the side-input patterns for the second output and so on.

For each multi-stage thus created, early and late signal waveforms will be calculated by means of analog simulation in the embodiment and then it will be checked whether these early and late signals fulfill the required timing criteria similar to conventional static timing analysis.

In order to speed up the processing or enumeration of the multi-stages as shown by the table, in case one of the sets in a row is an empty set, the entire row is skipped. This avoids redundant multi-stages, i.e. repeated calculations of the same signal waveforms.

When sequential cells are present in the circuit, in embodiments of the invention "nodeset files" may be used for controlling the initialization of simulation runs of the cells, i.e. for initiating the nodes of the cells to defined starting values, to ensure that the analog simulations of the cells are performed starting in a well-defined state.

To show the way the above embodiments work more clearly, further embodiments will be discussed with reference to FIGS. 4 and 5 which combine or use features of the already discussed embodiments.

Figure 4:
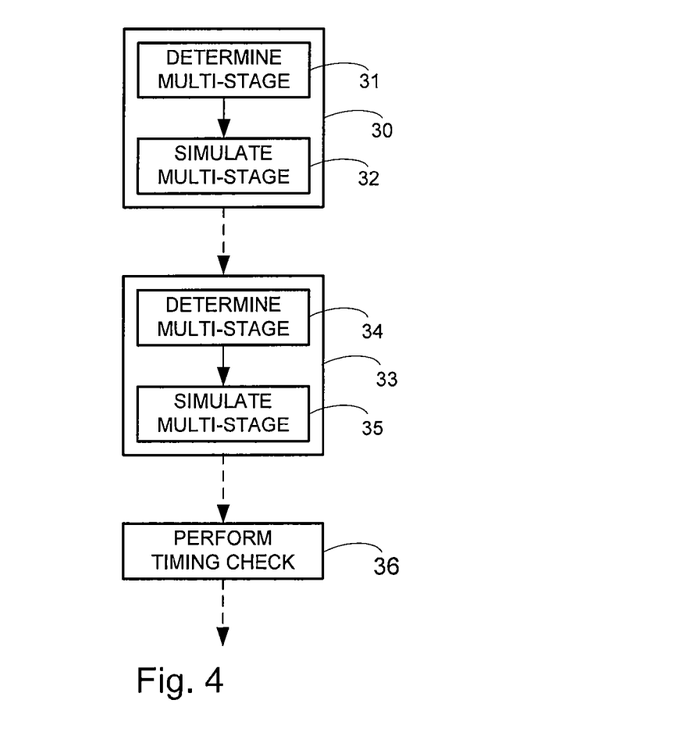
FIG. 4 is a flow diagram showing an embodiment of a method according to the present invention.

FIG. 4 is a flow diagram of an embodiment of a method according to the present invention for performing a timing analysis of a circuit. Similar to conventional static timing analysis, the circuit to be evaluated is partitioned in stages, and these stages are sorted (so-called topological sorting) such that the order in which the states are processed is such that the input signals necessary for a stage which are generated by a preceding stage are available when said stage is evaluated.

Of the evaluating steps for the stages, two are shown and designated with reference numerals 30 and 33 in FIG. 4. As indicated by the dashed arrows, these two evaluation steps 30 and 33 represent a greater number of evaluation step depending on the number of stages of the circuit.

In evaluation step 30, in a substep 31 according to the embodiment shown multi-stages for the stage under evaluation are determined, i.e. the receiver trees to be considered and the side input patterns to be considered are determined using the embodiments discussed above, i.e. using shielding-grade values and load prioritization. In a second substep 32, these multi-stages are simulated to obtain the waveforms, for example using analog simulation.

It should be noted that substeps 31 and 32 may be performed sequentially as shown in FIG. 4, but also may be performed interdependently. In the latter case, each time a receiver tree has been determined for a particular side input pattern to be considered, the simulation of step 32 is performed before considering the next input pattern.

Substeps 34 and 35 of step 33 correspond to substeps 31 and 32 of step 30 for a different stage under evaluation.

As indicated by step 36, when the receiving element coupled to an output of a stage is a stage where a timing check is to be performed, this is done in step 36. Such receiving elements where timing checks are performed are for example flipflops or other storage elements where the output signal of the stage is for example sampled by a clock signal, whereas for other types of cells like logic gates depending on the circuit no timing check is performed. As indicated by a dashed arrow below step 36, after this further stages are evaluated. In this respect, it should be noted that timing checks may also be performed after all the stages have been simulated according to steps 30, 33.

Figure 5:
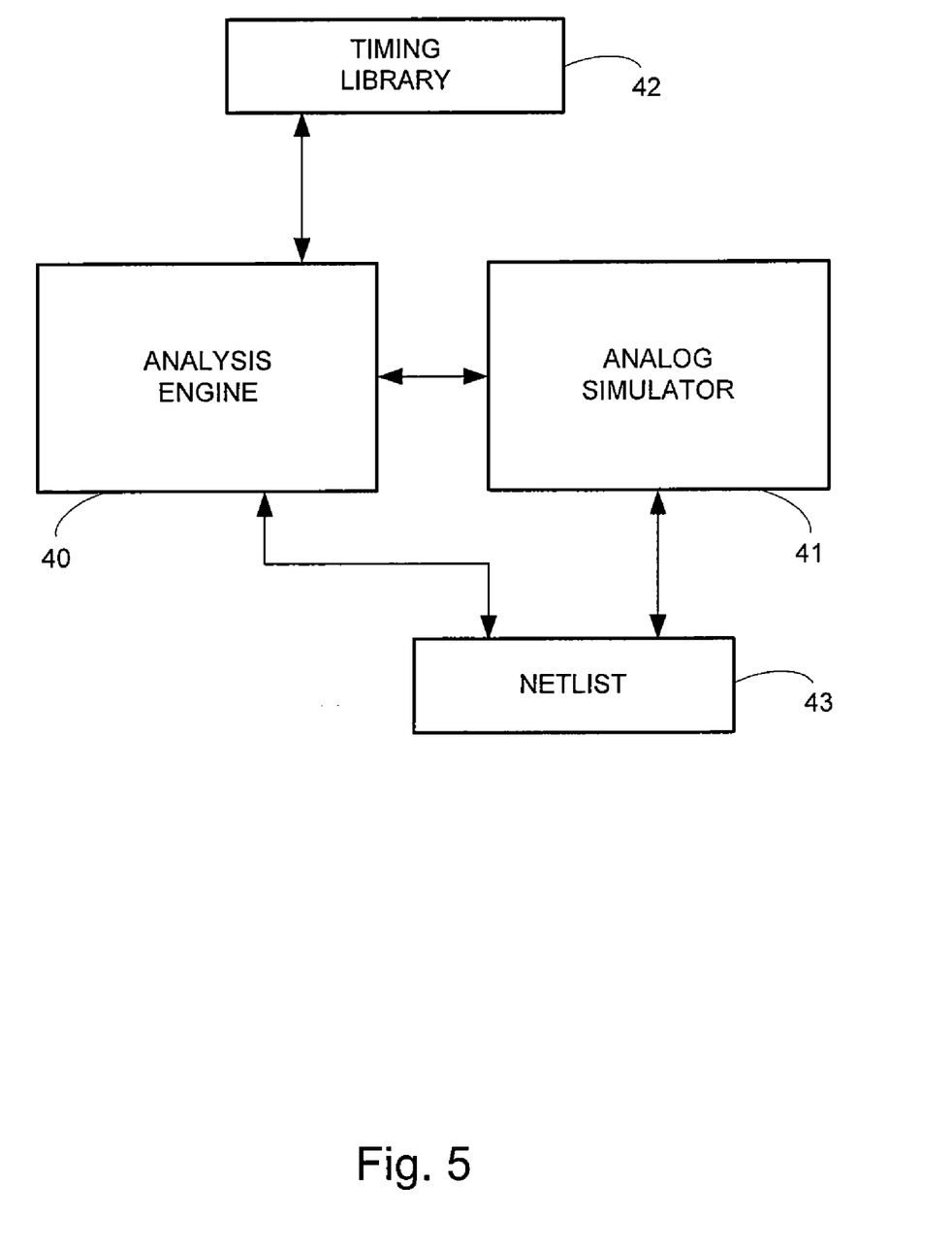
FIG. 5 is a block diagram showing an embodiment of an apparatus of the present invention.

An apparatus according to an embodiment of the present invention with which for example the method of FIG. 4 or any other method previously discussed may be implemented is shown in FIG. 5. The apparatus of FIG. 5 comprises an analysis engine controlling the overall procedure, an analog simulator 41 for performing analog simulations of the multi-stages, both of which may be implemented as software in a computer, for example a personal computer. The analysis engine has access to timing library 42 where for various cells which may be used in electronic circuits information like the shielding-grade information and the load prioritization information is stored. Timing library 42 may be stored in a random access memory of a computer, a read only memory of a computer, a hard disk or any other type of storage medium. The apparatus of FIG. 5 is further provided with information 43 comprising a netlist of the electronic circuit to be simulated and in particular of the cells of the electronic circuit. The netlist is used for determining the stages of the circuit. The analog simulator 41 uses receivers from analysis engine 40 the information necessary for being able to simulate a multi-stage, for example the part of the netlist forming the multi-stage. Besides said netlist, information 43 may comprise clock definitions, simulation parameters, temperatures, device parameters, transistor models, information regarding parasitic elements of the circuit, information regarding so-called exceptions, side constraints and/or any other kind of information usable or necessary for performing simulations of the circuit.

As a matter of course, the above embodiments are only to be taken as examples and not as limitative. In particular, the various features described may be used both in combination and separately to perform timing analysis of electronic circuits including timing checks.

The invention claimed is:

1. A method for performing a timing analysis of an electronic circuit, the method comprising executing instructions stored on a computer-readable medium that cause a processor to:

define a stage having an input and at least one output;

determine a circuit portion connected to the at least one output influencing a timing behavior of said stage based on information characterizing a coupling of said circuit portion to said stage, wherein a portion of said electronic circuit coupled to said at least one output comprises a plurality of cells, and wherein said information comprises at least one shielding-grade value corresponding to each of the plurality of cells, wherein said shielding-grade value is a value representing magnitude of influence of a corresponding cell on the timing behavior of said stage, and wherein determining said circuit portion comprises adding shielding-grade values of successive cells connected in series relative to said at least one output of said stage until a sum of the added shielding-grade values is equal to or larger than a predetermined shielding-grade limit, wherein said circuit portion is determined to be the cells connected in series to said at least one output that correspond to the added shielding-grade values; and evaluate, for said timing analysis, the timing behavior of said stage based on a simulation of said stage and said circuit portion.

2. The method according to claim 1, wherein said information is stored in a timing library.

3. The method according to claim 1, wherein said information comprises a plurality of shielding-grade values attributed to timing arcs of each cell.

4. The method according to claim 1, wherein said simulation comprises an analog simulation.

5. The method according to claim 1, wherein said simulation comprises:
determining a latest signal at said at least one output and an earliest signal at said at least one output; and
checking whether said latest signal and said earliest signal arrive at said output within a predetermined time frame.

6. The method according to claim 1, wherein said electronic circuit is a synchronous digital circuit.

7. A method for performing a timing analysis of an electronic circuit, the method comprising executing instructions stored on a computer-readable medium that cause a processor to:
define a stage having an input and at least one output, wherein an input of a circuit portion is connected to said at least one output, said circuit portion having at least one further input;
select at least one configuration of said at least one further input based on information stored in a library, said information comprising load priority information that comprises at least one load priority value assigned to each of different timing arcs of cells of said circuit portion based on relative loads of each of said different timing arcs, wherein said at least one load priority value identifies an order of said relative loads, and wherein said selecting of said at least one configuration is performed based on said at least one load priority value; and
perform a timing analysis, said timing analysis comprising simulating said circuit portion with said at least one configuration.

8. The method according to claim 7, wherein selecting at least one configuration comprises selecting at least one configuration such that a load represented by the circuit portion assumes a maximum value.

9. The method according to claim 7, wherein selecting at least one configuration comprises selecting at least one configuration such that a load represented by the circuit portion assumes a minimum value.

10. The method according to claim 7, wherein performing said timing analysis comprises simulating signal waveforms propagating in said stage.

11. The method according to claim 7, wherein selecting said at least one configuration comprises selecting a configuration where a path from said input of said circuit portion to an output of said circuit portion is an inverting path; and selecting a configuration where said path from said input of said circuit portion to an output of said circuit portion is a non-inverting path.

12. The method according to claim 7, wherein said order of said relative loads identified by said at least one load priority value indicates an order of said different timing arcs from a timing arc with a lowest relative load to a timing arc with a highest relative load.

13. The method according to claim 7, wherein said at least one load priority value comprises a maximum load priority value and a minimum load priority value assigned to each of said different timing arcs based on said relative load of each of said different timing arcs, wherein:
a lowest maximum load priority value is assigned to a timing arc with a largest load relative to the other timing arcs of said cells, with the other timing arcs being assigned maximum load priority values in ascending order from the lowest maximum load priority value according to descending relative load.

14. The method according to claim 13, wherein a lowest minimum load priority value is assigned to a timing arc with a smallest load relative to the other timing arcs of said cells, with the other timing arcs being assigned minimum load priority values in ascending order from the lowest minimum load priority value according to ascending load.

15. A method for performing a timing analysis of an electronic circuit, the method comprising executing instructions stored on a computer-readable medium that cause a processor to:
define a stage having an input and at least one output;
determine a circuit portion connected to at least one output influencing the timing behavior of said stage based on information characterizing a coupling of said circuit portion to said stage,
wherein a portion of said electronic circuit coupled to said at least one output comprises a plurality of cells, and
wherein said information comprises at least one shielding-grade value corresponding to each of the plurality of cells, wherein said shielding-grade value is a value representing magnitude of influence of a corresponding cell on the timing behavior of said stage, and wherein determining said circuit portion comprises adding shielding-grade values of successive cells connected in series relative to said at least one output of said stage until a sum of the added shielding-grade values of cells connected in series to said at least one output is equal to or larger than a predetermined shielding-grade limit, wherein said circuit portion is determined to be the cells connected in series to said at least one output that correspond to the added shielding-grade values;
evaluate, for said timing analysis, a timing behavior of said stage based on a simulation of said stage; and
use a simulated waveform of a signal at an output of said least one output as an input waveform for simulating a further stage, said further stage having said output as an input.

16. The method according to claim 15, where executing instructions stored on the computer-readable medium further cause the processor to store said waveform.

17. The method according to claim 15, wherein said evaluating step comprises evaluating the timing behavior of said stage based on a simulation of said stage and said circuit portion.

18. The method according to claim 15, wherein an input of a circuit portion is connected to said at least one output, said circuit portion having at least one further input, where executing instructions stored on the computer-readable medium further cause the processor to select at least one configuration of said at least one further input, and wherein said simulation comprises a simulation of said circuit portion with said at least one configuration.

19. An apparatus for performing a timing analysis of an electronic circuit, comprising:
a timing analyzer, said timing analyzer comprising a analysis module, said analysis module operable to execute instructions stored in a computer-readable medium to:

define a stage having an input and at least one output;
determine a circuit portion connected to at least one output influencing a timing behavior of said stage based on information characterizing a coupling of said circuit portion to said stage,
wherein a portion of said electronic circuit coupled to said at least one output comprises a plurality of cells,
wherein said information comprises at least one shielding-grade value corresponding to each of the plurality of cells wherein said shielding-grade value is a value representing a magnitude of influence of a corresponding cell on the timing behavior of said stage, and wherein determining said circuit portion comprises adding shielding-grade values of successive cells connected in series relative to said at least one output of said stage until a sum of the added shielding-grade values of is equal to or larger than a determined shielding-grade limit value, wherein said circuit portion is determined to be the cells connected in series to said at least one output that correspond to the added shielding-grade values; and
evaluate, for the timing analysis, the timing behavior of said stage based on a simulation of said stage and said circuit portion by an analog simulator of said apparatus.

20. The apparatus according to claim 19, further comprising a timing library wherein said information is stored.

21. The apparatus according to claim 19, wherein said information comprises a plurality of shielding-grade values attributed to timing arcs of each cell.

22. The apparatus according to claim 19, wherein said simulation comprises determining a latest signal at said at least one output and an earliest signal at said at least one output and said instructions further comprise instructions to check whether said latest signal and said earliest signal arrive at said output within a predetermined time frame.

23. An apparatus for performing a timing analysis of an electronic circuit, comprising:
a timing library; and
a timing analyzer, said timing analyzer comprising an analysis module, said analysis module operable to execute instructions stored in a computer-readable medium to:
define a stage having an input and at least one output, wherein an input of a circuit portion is connected to said at least one output, said circuit portion having at least one further input;
select at least one configuration of said at least one further input based on information stored in said timing library, said information comprising load priority information that comprises at least one load priority value assigned to each of different timing arcs of cells of said circuit portion based on relative loads of each of said different timing arcs, wherein said at least one load priority value identifies an order of said relative loads, and wherein said selecting of said at least one configuration is performed based on said at least one load priority value; and
perform a timing analysis, said timing analysis comprising simulating said circuit portion with said at least one configuration with an analog simulator including said apparatus.

24. The apparatus according to claim 23, wherein the instructions to select at least one configuration comprise instructions to select at least one configuration such that the load represented by the circuit portion assumes a maximum value.

25. The apparatus according to claim 23, wherein the instructions to select at least one configuration comprise instructions to select at least one configuration such that the load represented by the circuit portion assumes a minimum value.

26. The apparatus according to claim 23, wherein performing said timing analysis comprises simulating signal waveforms propagating in said stage.

27. The apparatus according to claim 23, wherein the instructions to select said at least one configuration comprise instructions to select a configuration where a path from said input of said circuit portion to an output of said circuit portion comprises an inverting path; and instructions to select a configuration where said path from said input of said circuit portion to an output of said circuit portion comprises a non-inverting path.

28. The apparatus according to claim 23, wherein said order of said relative loads identified by said at least one load priority value indicates an order of said different timing arcs from a timing arc with a lowest relative load to a timing arc with a highest relative load.

29. The apparatus according to claim 23, wherein said at least one load priority value comprises maximum load priority values and minimum load priority values assigned to each of said timing arcs based on said relative load of each of said timing arcs, wherein:
a lowest maximum load priority value is assigned to a timing arc with a largest load relative to the other timing arcs of said cells, with the other timing arcs being assigned maximum load priority values in ascending order from the lowest maximum load priority value according to descending relative load.

30. The apparatus according to claim 29, wherein a lowest minimum load priority value is assigned to a timing arc with a smallest load relative to the other timing arcs of said cells, with the other timing arcs being assigned minimum load priority values in ascending order from the lowest minimum load priority value according to ascending load.

31. An apparatus for performing a timing analysis of an electronic circuit, comprising:
a timing analyzer, said timing analyzer comprising a analysis module, said analysis module operable to execute instructions stored in a computer-readable medium to:
define a stage having an input and at least one output;
determine a circuit portion connected to at least one output influencing the timing behavior of said stage based on information characterizing a coupling of said circuit portion to said stage,
wherein a portion of said electronic circuit coupled to said at least one output comprises a plurality of cells, and
wherein said information comprises at least one shielding-grade value corresponding to each of the plurality of cells, wherein said shielding-grade value is a value representing magnitude of influence of a corresponding cell on the timing behavior of said stage, and wherein determining said circuit portion comprises adding shielding-grade values of successive cells connected in series relative to said at least one output of said stage until a sum of the added shielding-grade values is equal to or larger than a predetermined shielding-grade limit, wherein said circuit portion is determined to be the cells connected in series to said at least one output that correspond to the added shielding-grade values;
evaluate, for said timing analysis, a timing behavior of said stage based on a simulation of said stage; and use a simulated waveform of a signal at an output of said least one output as an input waveform for simulating a further stage, said further stage having said output as an input.

32. The apparatus according to claim 31, said instructions comprise instructions to store said waveform.

33. The apparatus according to claim 31, wherein said evaluating comprises evaluating the timing behavior of said stage based on a simulation of said stage and said circuit portion.

34. The apparatus according to claim 31, wherein an input of said circuit portion is connected to said at least one output, said circuit portion having at least one further input, said instructions further comprise instructions to:
  select at least one configuration of said at least one further input, wherein said simulation comprises a simulation of said circuit portion with said at least one configuration.

35. An apparatus for performing a timing analysis of an electronic circuit, comprising:
  means for defining a stage having an input and at least one output;
  means for determining a circuit portion connected to at least one output influencing a timing behavior of said stage based on information characterizing a coupling of said circuit portion to said stage,
    wherein a portion of said electronic circuit coupled to said at least one output comprises a plurality of cells, and
    wherein said information comprises at least one shielding-grade value corresponding to each of the plurality of cells, wherein said shielding-grade value is a value representing a magnitude of influence of a corresponding cell on the timing behavior of said stage, and wherein determining said circuit portion comprises adding shielding-grade values of successive cells connected in series relative to said at least one output of said stage until a sum of the added shielding-grade values is equal to or larger than a predetermined shielding-grade limit, wherein said circuit portion is determined to be the cells connected in series to said at least one output that correspond to the added shielding-grade values; and
  means for evaluating, for said timing analysis, the timing behavior of said stage based on a simulation of said stage and said circuit portion.

36. An apparatus for performing a timing analysis of an electronic circuit, comprising:
  means for defining a stage having an input and at least one output, wherein an input of a circuit portion is connected to said at least one output, said circuit portion having at least one further input;
  means for selecting at least one configuration of said at least one further input based on information stored in a library, said information comprising load priority information that comprises at least one load priority value assigned to each of different timing arcs of cells of said circuit portion based on relative loads of each of said different timing arcs, wherein said at least one load priority value identifies an order of said relative loads, and wherein said selecting of said at least one configuration is performed based on said at least one load priority value;
  means for evaluating a timing behavior of said stage based on a simulation of said stage and said circuit portion with said at least one configuration; and
  means for using a simulated waveform of a signal at an output of said least one output as an input waveform for simulating a further stage, said further stage having said output as an input.

37. The apparatus according to claim 36, wherein said order of said relative loads identified by said at least one load priority value indicates an order of said different timing arcs from a timing arc with a lowest relative load to a timing arc with a highest relative load.

38. The apparatus according to claim 36, wherein said at least one load priority value comprises maximum load priority values and minimum load priority values assigned to each of said timing arcs based on said relative load of each of said timing arcs, wherein:
  a lowest maximum load priority value is assigned to a timing arc with a largest load relative to the other timing arcs of said cells, with the other timing arcs being assigned maximum load priority values in ascending order from the lowest maximum load priority value according to descending relative load.

39. The apparatus according to claim 38, wherein a lowest minimum load priority value is assigned to a timing arc with a smallest load relative to the other timing arcs of said cells, with the other timing arcs being assigned minimum load priority values in ascending order from the lowest minimum load priority value according to ascending load.

* * * * *